(12) United States Patent
Balakrishnan

(10) Patent No.: US 7,340,659 B2
(45) Date of Patent: Mar. 4, 2008

(54) METHOD OF TESTING MULTIPLE MODULES ON AN INTEGRATED CIRCUIT

(75) Inventor: Prashant Balakrishnan, Singapore (SG)

(73) Assignee: Infineon Technologies, A.G., Munich (DE)

( * ) Notice: Subject to any disclaimer, the term of this patent is extended or adjusted under 35 U.S.C. 154(b) by 526 days.

(21) Appl. No.: 10/439,345

(22) Filed: May 15, 2003

(65) Prior Publication Data
US 2003/0221150 A1 Nov. 27, 2003

(30) Foreign Application Priority Data
May 15, 2002 (WO) .................... PCT/SG02/00094

(51) Int. Cl.
*G01R 31/28* (2006.01)
(52) U.S. Cl. ................. 714/729; 714/726; 714/742
(58) Field of Classification Search ............... None
See application file for complete search history.

(56) References Cited
U.S. PATENT DOCUMENTS

| | | | |
|---|---|---|---|
| 5,313,475 A * | 5/1994 | Cromer et al. .............. 714/758 |
| 5,565,801 A | 10/1996 | Ernst | |
| 5,581,565 A | 12/1996 | Meyer | |
| 5,731,701 A | 3/1998 | Lee | |
| 5,751,736 A | 5/1998 | Deroux-Dauphin et al. | |
| 5,889,713 A | 3/1999 | Chan et al. | |
| 6,185,721 B1 * | 2/2001 | Hosokawa ..................... 716/5 |
| 6,408,417 B1 * | 6/2002 | Moudgal et al. ............ 714/764 |
| 6,437,553 B1 * | 8/2002 | Maloney et al. ......... 324/76.35 |
| 6,854,078 B2 * | 2/2005 | Kinoshita et al. ........... 714/718 |
| 2003/0056164 A1 * | 3/2003 | Lauga ........................ 714/726 |

* cited by examiner

*Primary Examiner*—Cynthia Britt
*Assistant Examiner*—John J. Tabone, Jr.
(74) *Attorney, Agent, or Firm*—Senniger Powers

(57) ABSTRACT

An integrated circuit (20) comprises a plurality of processing modules (3, 5, 7) which interact during the normal operation of the integrated circuit. Switches (13, 15) are provided on the integrated circuit (20) and operated during a testing procedure to isolate a single module (3) or a group of modules (5, 7) from the other modules, so that that the isolated module or group of modules can be tested. During the testing procedure, the switches (13, 15) provide defined signals at inputs of the isolated module(s) which, when the integrated circuit is in normal operation, are controlled by outputs of the other modules.

7 Claims, 3 Drawing Sheets

METHOD OF TESTING MULTIPLE MODULES ON AN INTEGRATED CIRCUIT

FIELD OF THE INVENTION

The present invention relates to methods for testing integrated circuits including a plurality of processing modules. The invention further relates to integrated circuits which can be tested using the method.

BACKGROUND OF THE INVENTION

An integrated circuit 10 of a known design having a plurality of processing modules, is shown schematically in FIG. 1. In FIG. 1, for simplicity only three modules 3, 5, 7 are shown. Each module 3, 5, 7 has inputs labelled i1, i2, . . . and outputs labelled o1, o2, . . . . The integrated circuit has a plurality of input pins 9 (for simplicity only two such inputs 9 is shown), which receive in put signals which are transmitted to one of more of the modules 3, 5, 7, and also output pins 11 (for simplicity only two such output pins 11 are shown). Furthermore, the modules 3, 5, 7 are interconnected, such that signals generated at some outputs of some modules are transmitted to be inputs of other modules (e.g. the output o2 of module 5 is the input i2 of module 7). In other words, a given module 3, 5, 7 may have any number of two different sorts of input pins: input pins which input signals directly received by the integrated circuit and input pins which receive the outputs of other pins.

Due to problems in the production process of the integrated circuits, individual modules 3, 5, 7 may be faulty, and therefore integrated circuits should be tested to identify if the integrated circuits are faulty, and in what respect. Typically, an integrated circuit 1 is tested by sequentially supplying predefined sets of signals to the input pins 9 of the integrated circuit, and observing the signals output from the output pins 11 of the integrated circuit. The term "scan chain" is used to refer to the path from the input pins, through one or more modules 3, 5, 7 being tested at any given time, to the output pins.

A problem with such an approach is that it can be a complex operation to adequately test all the modules 3, 5, 7 of the chip, because of interactions between the modules 3, 5, 7. The problem is particularly acute if the number of input pins 9 to the integrated circuit (only two in the simplified example of FIG. 1) and/or the number of output pins 11 of the integrated circuit (again, two in the example of FIG. 1), are less than the total number of inputs to all the modules 3, 5, 7 (eight in the simplified example of FIG. 1). In this case, it may be impossible in principle to identify which of the modules 3, 5, 7 is at fault and what type of fault it is.

The reason for this is that the scan chains are entangled, since one module being tested will influence other modules. For example, if a given first module 3 is faulty such that it generates an erroneous output signal to a second module 5, it can be impossible to identify whether the problem is with the first module 3 or the second module 5. If, during the testing procedure all but one of the modules are disabled completely (so that only one scan chain is enabled) then the ability of that module to send/receive signals to/from other modules is not checked at all.

SUMMARY OF THE INVENTION

The present invention seeks to alleviate at least partially the problem described above.

The present invention proposes a method for testing an integrated circuit comprising multiple processing modules. The method is suitable for testing an integrated circuit which does not have a sufficient number of pins for testing using conventional I/O pins.

In further aims to provide an integrated circuit which can be tested using the method.

The present invention proposes in general terms that switch means provided on the integrated circuit are operated during the testing procedure to logically isolate a single module or a group of modules from the other modules, so that that the isolated module or group of modules can be tested. Thus, a single scan chain (i.e. the inputs to the integrated circuit, the isolated module(s), and the outputs of the integrated circuit) can be tested independently of the other modules. A series of such scan chains may be tested successively, by different settings of the switch means.

Preferably, the switch means include switches operative, during the testing procedure, to provide defined signals at inputs of the isolated module(s) which, when the integrated circuit is in normal operation, will be controlled by outputs of the other modules. For example, the switches may operative to determine selectively whether the inputs to module(s) of a scan chain which is presently being tested are derived from (i) modules of other scan chains (as in the normal operation of the integrated circuit) or (ii) from an off-chip source (e.g. from input pins of the integrated circuit which are dedicated to providing signals during the testing procedure, or input pins which do not provide inputs to the modules of the scan chain during the normal operation of the integrated circuit but do provide inputs to other modules during the normal operation of the integrated circuit).

The total number of inputs to the isolated module(s) should preferably be approximately no more than the number of inputs to the integrated circuit, and the total number of outputs from the isolated module(s) should preferably be approximately no more than the number of outputs from the integrated circuit, so that the isolated module(s) can be adequately tested.

Once the test of a given scan chain is complete, the switch means are controlled to isolate a different module, or set of modules, so that a different scan chain can be tested. In this way, successive scan chains can be tested.

Note that it may not be necessary in practice to isolate completely the module(s) of the scan chain which is presently being tested from the other modules. Rather it may be possible to obtain an adequate level of testing when only a certain proportion of the inputs to the module(s) of the present scan chain are being controlled.

Preferably, an XOR tree is provided on the integrated circuit, combining the outputs from modules of multiple scan chains, and in particular outputs from modules which in the normal operation of the integrated circuit are transmitted to other modules. While any one of the scan chains is being tested, the varying outputs of the module(s) of the presently tested scan chain will toggle, so the output of the XOR tree will toggle, and thus the output of the module(s) of the presently tested scan chain can be determined.

Specifically, in a first aspect the invention provides an integrated circuit comprising a plurality of processing modules, outputs of one or more of the modules providing inputs for other of the modules, the integrated circuit further including switch means for selectively interrupting the passage of signals between at least two of the modules, whereby during a testing mode the switch means are operable to permit independent testing of the modules.

In a second aspect the invention provides a method of testing an integrated circuit which has a plurality of input pins, a plurality of output pins, and a plurality of processing modules arranged to transmit signals to each other, the method comprising, for successive scan chains which each include one or more of the modules, (i) operating switch means located on the integrated circuit to interrupt the passage to modules of the scan chain of signals from modules which are not part of the scan chain;

(ii) controlling the inputs of the integrated circuit; and (iii) observing the corresponding outputs of the integrated circuit, to observe anomalies in the operation of the scan chain.

BRIEF DESCRIPTION OF THE FIGURES

An embodiment of the invention will now be described in detail for the sake of example only, with reference to the following figures in which.

DETAILED DESCRIPTION OF THE EMBODIMENT

Figure 1:
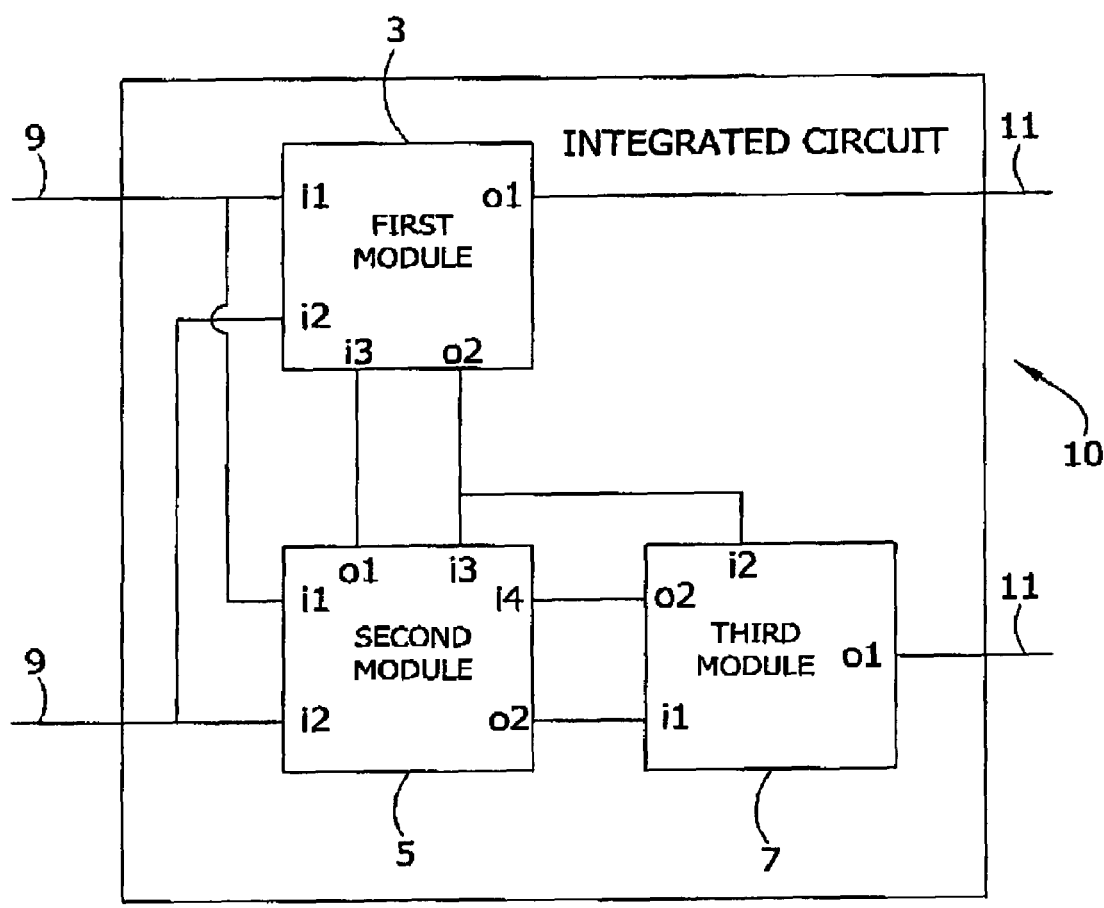
FIG. 1 shows schematically a known integrated circuit.
Figure 2:
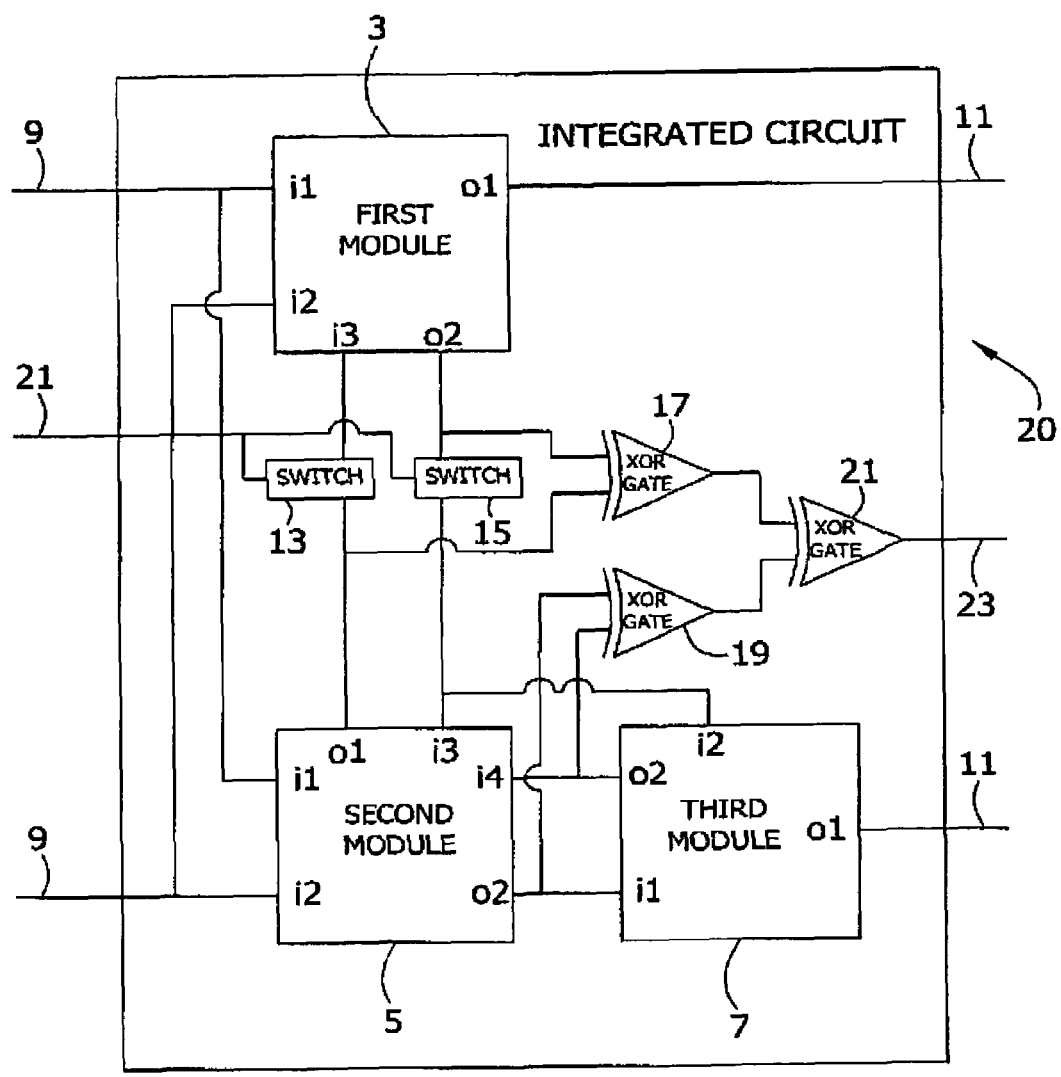
FIG. 2 shows schematically an integrated circuit according to the invention.

Referring to FIG. 2, an integrated circuit 20 which is an embodiment of the invention is illustrated. The integrated contains many elements which are identical to those of the circuit of FIG. 1, and these are given equal reference numerals in FIG. 2.

There are two main differences between FIG. 1 and FIG. 2.

Firstly, two additional switch elements 13, 15 are provided, controlled by an extra input 21 to the integrated circuit. A first switch element 13 is between the output o1 of module 5 and the input i3 of module 3. A second switch element 15 is between the output o2 of module 3 and the inputs i3 of module 5 and i2 of module 7.

In the normal mode of operation of the integrated circuit 20, the switch elements 13, 15 are transparent to the signals passing between the modules 3, 5, 7.

However, when a testing operation is to be performed, the switches 13 and 15 are operative under the control of the input 21 to control the inputs respectively to the module 3 and to the modules 5, 7, as described in detail below.

Secondly, an XOR tree is provided constructed out from the XOR gates 17, 19, 21. A first XOR gate 17 receives the outputs o2 of the module 3 and the output 01 of the module 5. A second XOR gate 19 receives the outputs o2 of the modules 5, 7. A third XOR gate 21 receives the outputs of the XOR gates 17, 19. Thus, the output of the XOR gate 21, which is extracted from the integrated circuit through a dedicated output 23, toggles whenever one of the outputs at the inputs to the XOR tree toggles.

The testing operation will now be described in detail.

Firstly, there is a test of a scan tree consisting only of the inputs 9, 21 to the integrated circuit, the module 3 and the outputs 11, 23. The switch 13 is controlled via the pin 21 to control the i3 input to the module 3. In this way, the module 3 is isolated from the modules 5, 7. The set of inputs 9, 21 are then taken through a sequence of values by a known ATPG tool (Automatic Test Pattern Generation tool), and the corresponding outputs of the pins 11 and 23 are observed, to identify any faults in this first scan chain.

Note that the switch 13 may have a further input (not shown) which actually controls the value input to the input i3 of the module 3. This input may be from a further input pin of the integrated circuit not shown in FIG. 2 (e.g. one which does not directly provide an input to module 3).

In a second stage of the test operation, the switch 15 is controlled to control the input i3 to the module 5 and to control the input i2 to the module 7. Once more the value of these inputs may be determined by a further input (not shown) to the integrated circuit 20. Thus, the group of modules 5, 7 are isolated from the module 3, and a second scan chain consisting of the inputs 9, 21 of the integrated circuit, the modules 5, 7, and the outputs 11, 23 can be tested by a predetermined scan of input values and an observation of the corresponding outputs of the integrated circuit.

Figure 3:
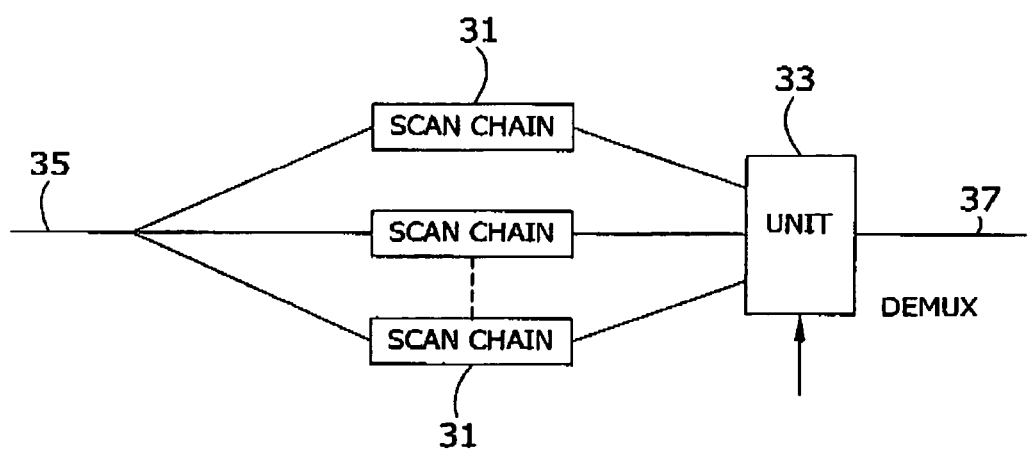
FIG. 3 shows an operating principle of the present invention.

We turn now to FIG. 3 which shows schematically the operating principle of a testing method according to the present invention. On the left of FIG. 3 is the set of inputs 35 to the integrated circuit (i.e. the set of values transmitted to the input pins 9, 21 of the integrated circuit) which are scanned through a sequence of values. The various scan chains 31 are shown in the middle of FIG. 3, each scan chain 31 being isolated during the time it is being tested from the other scan chains by the techniques discussed above, such that the inputs to any given scan chain from the modules of the other scan chains are controlled. The outputs from the scan chains 31 are combined by a unit 33 (representing the XOR tree and the basic outputs 11 of the integrated circuit) to form a result 37. Each of the scan chains 31 is tested in turn by scanning the set 35 and observing the output 37.

Although only a single embodiment of the invention has been described here, the invention is not limited in this respect and many variations are possible within the scope of the invention as will be clear to a skilled reader. For example, the present invention is intended for use with integrated circuits much more complex than those of FIGS. 1 and 2, having at least 20, or at least 50 input pins.

Additionally, FIG. 2 presents an idealized form of the present invention, and in practice it may not be necessary for the testing scheme to control all the inputs to the module(s) of the scan chain which is being tested at any time. Rather, one or more of the inputs of the module(s) of one or more of the scan chains (typically inputs from other modules which are not part of the scan chain) may be allowed to remain at a value which is not controlled (e.g. a static value) while the corresponding scan chain is tested. In this case the isolated module(s) will not be fully tested, since the portions of the module(s) which function based on the inputs which are uncontrolled will not be tested. However, the level of testing which is still possible may be adequate in practical applications.

In particular, to minimize the amount of switching circuitry which is required to implement the invention, those switches may not selected so as not to be enough to make inoperative the modules which are not part of the scan chain. Those modules may be provided with the inputs to the scan chain, so that they will actually carry out a limited amount of processing. If, again to reduce switching circuitry overheads, not all the signal paths back to the modules of the scan chain are controlled by a switch such as 13, 15, then there will be an influence on the scan chain which is presently being checked from the operation of the modules outside the scan chain. In practice, this means that faults in modules outside the scan chain might not be distinguishable from errors in the scan chain itself. A trade-off must be struck between completely isolating the scan chain and minimizing the number of switches such as 13, 15 which are required. Various techniques may be used to increase the efficiency of this trade-off, such as techniques involving an XQR tree at the inputs to the integrated circuit.

In a further variation, it is possible that the testing of any given scan chain may not be completed before the testing moves on to the next scan chain. For example, it is possible within the scope of the invention to set the switches to isolate a first scan chain and partially test that chain, then set the switches to isolate a second scan chain and partially test that chain, then to set the switches to isolate the first scan chain again and complete the testing of that scan chain, then set the switches to isolate the second scan chain again and complete the testing of the second scan chain.

The invention claimed is:

1. An integrated circuit comprising:
   a plurality of processing modules arranged in a plurality of scan chains wherein outputs of one or more of the modules provide inputs for other of the modules,
   switch means for selectively isolating the modules of a selected scan chain from modules which are not part of the selected scan chain, the switch means being controllable by an input to the integrated circuit including a testing mode to provide successive testing of each scan chain with or without isolation,
   an XOR tree receiving signals which are transmitted between modules, as inputs, and
   a dedicated output of the integrated circuit to provide a combined output of the XOR tree.

2. An integrated circuit according to claim 1 wherein the switch means is operative to select whether an input to at least one module is from a second module or from a separate source.

3. An integrated circuit according to claim 1 wherein the switch means is operative to substantially isolate a selected set of one or more of said modules from the outputs of modules which are not part of the set.

4. A method of testing an integrated circuit which has a plurality of input pins, a plurality of output pins, and a plurality of processing modules arranged to transmit signals to each other,
   the method comprising, for successive scan chains which each include one or more of the modules,
   (i) operating switch means located on the integrated circuit to interrupt the passage to modules of the scan chain of signals from modules which are not part of the scan chain, the switch means being controllable by an input to the integrated circuit;
   (ii) controlling the inputs of the integrated circuit; and
   (iii) observing the corresponding outputs of the integrated circuit and observing a signal obtained from a tree of XOR gates provided on the integrated circuit and arranged to combine intermediate outputs of the modules for determining anomalies in the operation of the scan chain.

5. A method according to claim 4 wherein controlling the inputs includes scanning the inputs through a succession of predetermined values.

6. A method according to claim 4 wherein operating switch means located on the integrated circuit includes replacing a signal which is transmitted to an input of one of the modules of the scan chain from a module which is not part of the scan chain, with a signal which is obtained from off the integrated circuit.

7. A method according to claim 4 wherein the total number of inputs of the modules of the scan chain is no more than the number of inputs to the integrated circuit.

* * * * *

UNITED STATES PATENT AND TRADEMARK OFFICE
CERTIFICATE OF CORRECTION

PATENT NO. : 7,340,659 B2
APPLICATION NO. : 10/439345
DATED : March 4, 2008
INVENTOR(S) : Prashant Balakrishnan It is certified that error appears in the above-identified patent and that said Letters Patent is hereby corrected as shown below:

Title page, item [57] Abstract, line 6: "so that that the" should read -- so that the --.

Column 1, line 19: "receive in put signals" should read -- receive input signals --.

Column 1, line 20: "transmitted to one of more of" should read -- transmitted to one or more of --.

Column 2, line 6: "In further aims to provide" should read -- It further aims to provide --.

Column 2, line 12: "that that the isolated module" should read -- that the isolated module --.

Column 2, lines 22-23: "the switches may operative" should read -- the switches may be operative --.

Column 3, lines 32-33: the integrated contains" should read -- the integrated circuit contains --.

Column 4, line 44: "one of more of the inputs" should read -- one or more of the inputs --.

UNITED STATES PATENT AND TRADEMARK OFFICE
CERTIFICATE OF CORRECTION

PATENT NO.         : 7,340,659 B2
APPLICATION NO.    : 10/439345
DATED              : March 4, 2008
INVENTOR(S)        : Prashant Balakrishnan It is certified that error appears in the above-identified patent and that said Letters Patent is hereby corrected as shown below:

Column 4, line 56: "switches may not selected" should read -- switches may not be selected --.

Column 5, line 5: "XQR tree" should read -- XOR tree --.

Signed and Sealed this

Twenty-ninth Day of July, 2008

JON W. DUDAS
*Director of the United States Patent and Trademark Office*